(12) United States Patent
Mlinar

(10) Patent No.: US 9,287,316 B2
(45) Date of Patent: Mar. 15, 2016

(54) SYSTEMS AND METHODS FOR MITIGATING IMAGE SENSOR PIXEL VALUE CLIPPING

(71) Applicant: Semiconductor Components Industries, LLC, Phoenix, AZ (US)

(72) Inventor: Marko Mlinar, Horjul (SI)

(73) Assignee: Semiconductor Components Industries, LLC, Phoenix, AZ (US)

( * ) Notice: Subject to any disclaimer, the term of this patent is extended or adjusted under 35 U.S.C. 154(b) by 128 days.

(21) Appl. No.: 14/011,369

(22) Filed: Aug. 27, 2013

(65) Prior Publication Data

US 2014/0313375 A1    Oct. 23, 2014

Related U.S. Application Data

(60) Provisional application No. 61/814,131, filed on Apr. 19, 2013.

(51) Int. Cl.

| | |
|---|---|
| *H01L 27/146* | (2006.01) |
| *H04N 5/365* | (2011.01) |
| *H04N 9/04* | (2006.01) |
| *H04N 5/357* | (2011.01) |
| *H04N 5/367* | (2011.01) |

(52) U.S. Cl.
CPC .... *H01L 27/14685* (2013.01); *H01L 27/14621* (2013.01); *H01L 27/14623* (2013.01); *H04N 5/3572* (2013.01); *H04N 5/3651* (2013.01); *H04N 9/045* (2013.01); *H04N 5/367* (2013.01)

(58) Field of Classification Search
CPC ... H04N 5/3651; H04N 5/3572; H04N 5/367; H04N 9/045; H01L 27/14623; H01L 27/14621; H01L 27/14685
See application file for complete search history.

(56) References Cited

U.S. PATENT DOCUMENTS

| | | | |
|---|---|---|---|
| 6,714,241 B2 | 3/2004 | Baer | |
| 7,671,316 B2* | 3/2010 | Kanai et al. | ................. 250/208.1 |
| 7,714,913 B2 | 5/2010 | Sase et al. | |
| 2006/0221218 A1* | 10/2006 | Adler | ..................... H04N 9/045 348/266 |

(Continued)

OTHER PUBLICATIONS

Stern, U.S. Appl. No. 13/942,201, filed Jul. 15, 2013.

(Continued)

*Primary Examiner* — Luong T Nguyen
(74) *Attorney, Agent, or Firm* — Treyz Law Group, P.C.; Michael H. Lyons

(57) ABSTRACT

An imaging system may include image sensor pixels, converter circuitry, denoising circuitry, dark current subtraction circuitry, and storage and processing circuitry. The image sensor pixels may generate analog image signals and the converter circuitry may convert the analog image signals into digital pixel values. The denoising circuitry may generate denoised pixel values based on the digital pixel values. The dark current subtraction circuitry may subtract a dark current value from the denoised pixel values. The image sensor pixels and converter circuitry may generate pixel values in multiple color channels. The image sensor pixels may include clear color filter elements for generating clear pixel values. The storage and processing circuitry may determine different black pedestal values for each color channel and may add the black pedestal values to the pixel values from the corresponding color channel to mitigate pixel value clipping in a final image generated by the imaging system.

20 Claims, 6 Drawing Sheets

(56) References Cited

U.S. PATENT DOCUMENTS

| | | |
|---|---|---|
| 2008/0218615 A1* | 9/2008 | Huang et al. .................. 348/294 |
| 2012/0133803 A1* | 5/2012 | Lee et al. ...................... 348/243 |
| 2013/0206959 A1 | 8/2013 | Zhang |
| 2014/0027613 A1* | 1/2014 | Smith ........................ 250/208.1 |
| 2014/0125838 A1* | 5/2014 | Mackey ................. H04N 9/045 |
| | | 348/224.1 |

OTHER PUBLICATIONS

Mlinar, U.S. Appl. No. 13/736,768, filed Jan. 8, 2013.

* cited by examiner

SYSTEMS AND METHODS FOR MITIGATING IMAGE SENSOR PIXEL VALUE CLIPPING

This application claims the benefit of provisional patent application No. 61/814,131, filed Apr. 19, 2013, which is hereby incorporated by reference herein in its entirety.

BACKGROUND

This relates generally to imaging systems, and more particularly, to imaging systems with clear image pixels.

Image sensors are commonly used in electronic devices such as cellular telephones, cameras, and computers to capture images. In a typical arrangement, an electronic device is provided with an array of image pixels. The image pixels generate image signals in multiple color channels. Readout circuitry such as analog-to-digital converter circuits are commonly coupled to the image pixels for reading out image signals from the image pixels.

During image rendering, image signals generated by the array of image pixels may be subject to clipping at low light levels. Such clipping can undesirably modify the image signals and can cause nonlinear response in the image sensor. Image pixels may also be subject to undesirable dark current. If care is not taken, dark current removal and clipping can cause irreparable image artifacts in the final image produced by the image sensor.

In conventional imaging systems, a single black offset value is uniformly added to image signals generated by the image pixels in all color channels and dark current is ideally subtracted from the image signals prior to passing the image signals to the analog-to-digital converter circuits. However, image signal clipping can persist for some of the color channels when a single black offset value is uniformly added for all of the color channels and when dark current and all added offsets are subtracted from the image signals prior to denoising the image signals.

It would therefore be desirable to be able to provide imaging systems with improved image signal clipping mitigation capabilities.

DETAILED DESCRIPTION

Electronic devices such as digital cameras, computers, cellular telephones, and other electronic devices include image sensors that gather incoming light to capture an image. The image sensors may include arrays of image sensor pixels (sometimes referred to herein as image pixels). The image pixels in the image sensors may include photosensitive elements such as photodiodes that convert the incoming light into image signals. Image sensors may have any number of pixels (e.g., hundreds, thousands, millions or more). A typical image sensor may, for example, have hundreds of thousands or millions of pixels (e.g., megapixels). Image sensors may include control circuitry such as circuitry for operating the image pixels, readout circuitry for reading out image signals corresponding to the electric charge generated by the photosensitive elements, and, if desired, other processing circuitry such as analog processing circuitry and digital processing circuitry. An image sensor may be coupled to additional processing circuitry such as circuitry on a companion chip to the image sensor, circuitry in the device that is coupled to the image sensor by one or more cables or other conductive lines, or external processing circuitry.

Figure 1:
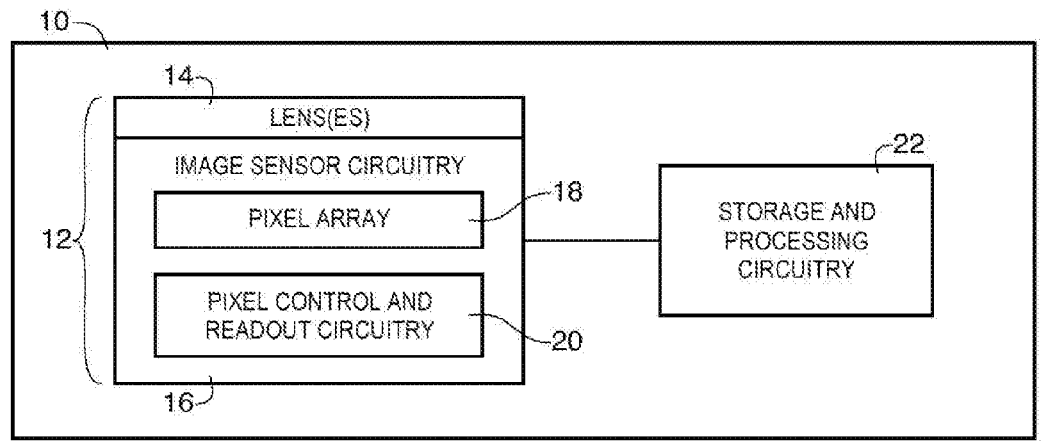
FIG. 1 is a diagram of an illustrative imaging system having an image sensor and processing circuitry in accordance with an embodiment of the present invention.

FIG. 1 is a diagram of an illustrative imaging system that uses an image sensor to capture images. Electronic device 10 of FIG. 1 may be a portable electronic device such as a camera, a cellular telephone, a video camera, or other imaging device that captures digital image data. Camera module 12 may be used to convert incoming light into digital image data. Camera module 12 may include one or more lenses 14 and image sensor circuitry 16 (e.g., one or more corresponding image sensors). Image sensor 16 may include an array of image sensor pixels 18 and pixel control and readout circuitry 20 (sometimes referred to herein as pixel readout circuitry 20 or pixel readout and processing circuitry 20). During image capture operations, light from a scene may be focused onto image sensor pixel array 18 by lens 14. Image sensor 16 may include any number of pixel arrays 18 (e.g., one pixel array, two pixel arrays, ten pixel arrays, etc.). If desired, camera module 12 may be provided with an array of lenses 14 and an array of corresponding image sensors 16.

Image sensor pixels in pixel array 18 may generate image signals in response to receiving light from a scene. For example, image sensor pixels in array 18 may include photosensitive elements such as photodiodes that convert incoming light into electric charge. Image pixels in pixel array 18 may be controlled using pixel control circuitry 20. Pixel control and readout circuitry 20 may include any desired pixel control and/or readout circuitry (e.g., row control circuitry, column read out circuitry, etc.). Pixel control and readout circuitry 20 may include converter circuitry include circuitry for converting analog image signals into corresponding digital image data pixel data (e.g., a respective pixel value generated by each image sensor pixel). Pixel values generated by pixel array 18 and readout circuitry 20 may be provided to storage and processing circuitry 22. If desired, pixel control and readout circuitry 20 may include denoising circuitry for performing denoising operations on image signals generated by pixel array 18.

Image sensor 16 may receive control signals from storage and processing circuitry 22 and may supply pixel data to storage and processing circuitry 22. Storage and processing circuitry 22 may include one or more integrated circuits (e.g., image processing circuits, microprocessors, storage devices such as random-access memory and non-volatile memory, etc.) and may be implemented using components that are separate from camera module 12 and/or that form part of camera module 12 (e.g., circuits that form part of an integrated circuit that includes image sensors 16 or an integrated circuit within module 12 that is associated with image sensors 16). Image data that has been captured by camera module 12 may be processed and stored using processing circuitry 22. Processed image data may, if desired, be provided to external equipment (e.g., a computer or other device) using wired and/or wireless communications paths coupled to processing circuitry 22.

Figure 2:
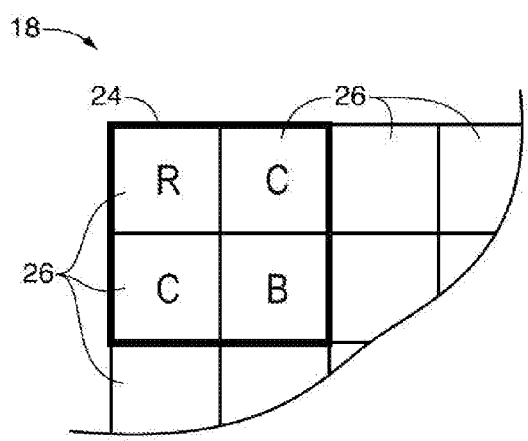
FIG. 2 is a diagram of an illustrative pixel unit cell in an image sensor pixel array having clear filter pixels in accordance with an embodiment of the present invention.

As shown in FIG. 2, image sensor 16 may include one or more arrays of image pixels such as pixel array 18 containing image sensor pixels 26. Array 18 may contain, for example, hundreds or thousands of rows and columns of image sensor pixels 26.

Image sensor pixels 26 may be covered by a color filter array that includes color filter elements over some or all image pixels 26. Color filter elements for image sensor pixels 26 may be red color filter elements (e.g., photoresistive material that passes red light while reflecting and/or absorbing other colors of light), blue color filter elements (e.g., photoresistive material that passes blue light while reflecting and/or absorbing other colors of light), green color filter elements (e.g., photoresistive material that passes green light while reflecting and/or absorbing other colors of light), clear color filter elements (e.g., transparent material that passes red, blue and green light) or other color filter elements. If desired, some or all of image pixels 26 may be provided without any color filter elements. Image pixels that are free of color filter material and image pixels that are provided with clear color filters may be referred to herein as clear pixels, white pixels, clear image pixels, or white image pixels. Clear image pixels 26 may have a natural sensitivity defined by the material that forms the transparent color filter and/or the material that forms the image sensor pixel (e.g., silicon). The sensitivity of clear image pixels 26 may, if desired, be adjusted for better color reproduction and/or noise characteristics through use of light absorbers such as pigments. Pixel array 18 having clear image pixels 26 may sometimes be referred to herein as clear filter pixel array 18.

Image sensor pixels such as image pixels are often provided with a color filter array which allows a single image sensor to sample red, green, and blue (RGB) light using corresponding red, green, and blue image sensor pixels arranged in a Bayer mosaic pattern. The Bayer mosaic pattern consists of a repeating unit cell of two-by-two image pixels, with two green image pixels diagonally opposite one another and adjacent to a red image pixel diagonally opposite to a blue image pixel. However, limitations of signal to noise ratio (SNR) that are associated with the Bayer Mosaic pattern make it difficult to reduce the size of image sensors such as image sensor 16. It may therefore be desirable to be able to provide image sensors with an improved means of capturing images.

In one suitable example that is sometimes discussed herein as an example, the green pixels in a Bayer pattern are replaced by clear image pixels, as shown in FIG. 2. A repeating two-pixel by two-pixel unit cell 24 of image pixels 26 may be formed from two clear image pixels (C) that are diagonally opposite one another and adjacent to a red (R) image pixel that is diagonally opposite to a blue (B) image pixel. Unit cell 24 may be repeated across clear filter pixel array 18 to form a mosaic of red, clear, and blue image pixels 26. Image pixels 26 may generate pixel values in associated color channels (e.g., each color channel corresponding to the color filter element of the associated image pixel). For example, red image pixels 26 may generate pixel values in a red channel, blue image pixels 26 may generate pixel values in a blue channel, and clear image pixels 26 may generate pixel values in a clear channel (e.g., red image pixels 26 may generate red pixel values in response to red light, blue image pixels 26 may generate blue pixel values in response to blue light, and clear image pixels 26 may generate clear pixel values in response to light across the visible spectrum). In this way, image sensor 16 having clear filter pixel array 18 may generate pixel values in multiple color channels.

The unit cell 24 of FIG. 2 is merely illustrative. If desired, unit cells 24 may include any suitable combination of two, three, four, or more than four image pixels. If desired, any color image pixels may be formed adjacent to the diagonally opposing clear image pixels 26 in unit cell 24 (e.g., the red image pixels in unit cell 24 may be replaced with blue image pixels, the blue image pixels in unit cell 24 may be replaced with red image pixels, the red image pixels in unit cell 24 may be replaced with yellow image pixels, the blue image pixels in unit cell 24 may be replaced with magenta image pixels, etc.).

Clear image pixels 26 can help increase the signal-to-noise ratio (SNR) of image signals captured by image sensor 16 by gathering additional light in comparison with image pixels having a narrower color filter (e.g., a filter that transmits light over a subset of the visible light spectrum), such as green image pixels. Clear image pixels 26 may particularly improve SNR in low light conditions in which the SNR can sometimes limit the image quality of images. Image signals gathered from image clear filter pixel may be converted to red, green, and blue image signals to be compatible with circuitry and software that is used to drive most image displays (e.g., display screens, monitors, etc.). This conversion generally involves the modification of captured image signals using a color correction matrix (CCM).

When capturing image data using clear filter pixel array 18, pixel values generated by clear image pixels 26 may have a greater average magnitude than pixel values generated by colored image pixels 26 (e.g., green image pixels, blue image pixels, red image pixels, etc.). Clear pixel values generated by array 18 may have greater signal-to-noise ratio (SNR) than color pixel values generated by array 18 (e.g., green pixel values, red pixel values, blue pixel values, etc.).

Pixel values generated by array 18 having relatively low magnitudes may be subject to clipping in which negative pixel values are truncated to zero (e.g., to a zero magnitude pixel value). Such clipping can undesirably modify the pixel values and can cause nonlinear response of image sensor 16. This can lead to errors during subsequent processing of captured image data using processing circuitry 22 and in final images generated by device 10. In scenarios where pixel arrays are provided with a Bayer filter, a single black pedestal (sometimes referred to herein as a black level, dark pedestal, black offset level, optical black level, or optical zero level) may be uniformly applied to each pixel value generated by the pixel array. The uniform black pedestal may be the lowest (or a certain lowest percentile) magnitude pixel value of all pixel values captured by the pixel array. The black pedestal may be uniformly added to each pixel value captured by the pixel array to prevent clipping of low magnitude pixel values. In clear filter pixel arrays such as clear filter pixel array 18 of FIG. 2, asymmetrical pixel value magnitude and SNR across color channels may cause clipping in some color channels even after a uniform black pedestal is added to the generated pixel values (e.g., different levels of clipping in each color channel may cause clipping to persist in some channels even after all of the pixel values have been adjusted using the uniform black pedestal).

Image pixels 26 in clear filter pixel array 18 may also be subject to undesirable dark current (e.g., due to heat in the semiconductor substrate of array 18 and other temperature effects within image sensor 16 that are independent of whether light is actually captured by image pixels 26). Image sensor 16 may include circuitry for removing dark current from the pixel values captured by clear filter pixel array 18. In some scenarios, dark current may be removed from analog pixel values prior to converting the pixel values to digital pixel values. However, performing full dark current subtraction prior to analog-to-digital conversion can cause excessive clipping for the pixel values generated by clear filter pixel array 18. It may therefore be desirable to be able to provide clear filter pixel array 18 with improved systems and methods for mitigating pixel value clipping.

Processing circuitry 22 may receive pixel values generated by image sensor 16. If desired, processing circuitry 22 may perform clipping correction operations on the received pixel values. For example, processing circuitry 22 may identify black pedestal values for the received pixel data and may apply the black pedestal values to the received pixel data. If desired, processing circuitry 22 may identify respective black pedestal values for each color channel of the received pixel values. For example, processing circuitry 22 may identify a first black pedestal value for clear pixel values generated by clear image pixels 26, may identify a second black pedestal value for blue pixel values generated by blue image pixels 26, and may identify a third black pedestal value for red pixel values generated by red image pixels 26.

Processing circuitry 22 may compute each black pedestal value based on pixel value statistics associated with the received pixel data. For example, processing circuitry 22 may compute greater black pedestal values for pixel value channels having a lesser average magnitude than for pixel value channels having a greater average magnitude. Processing circuitry 22 may add the first black pedestal value to the clear pixel values, may add the second black pedestal value to the blue pixel values, and may add the third black pedestal value to the red pixel values generated by clear filter pixel array 18. In this way, processing circuitry 22 may ensure that pixel values from each channel are free from clipping at low magnitudes.

Figure 3:
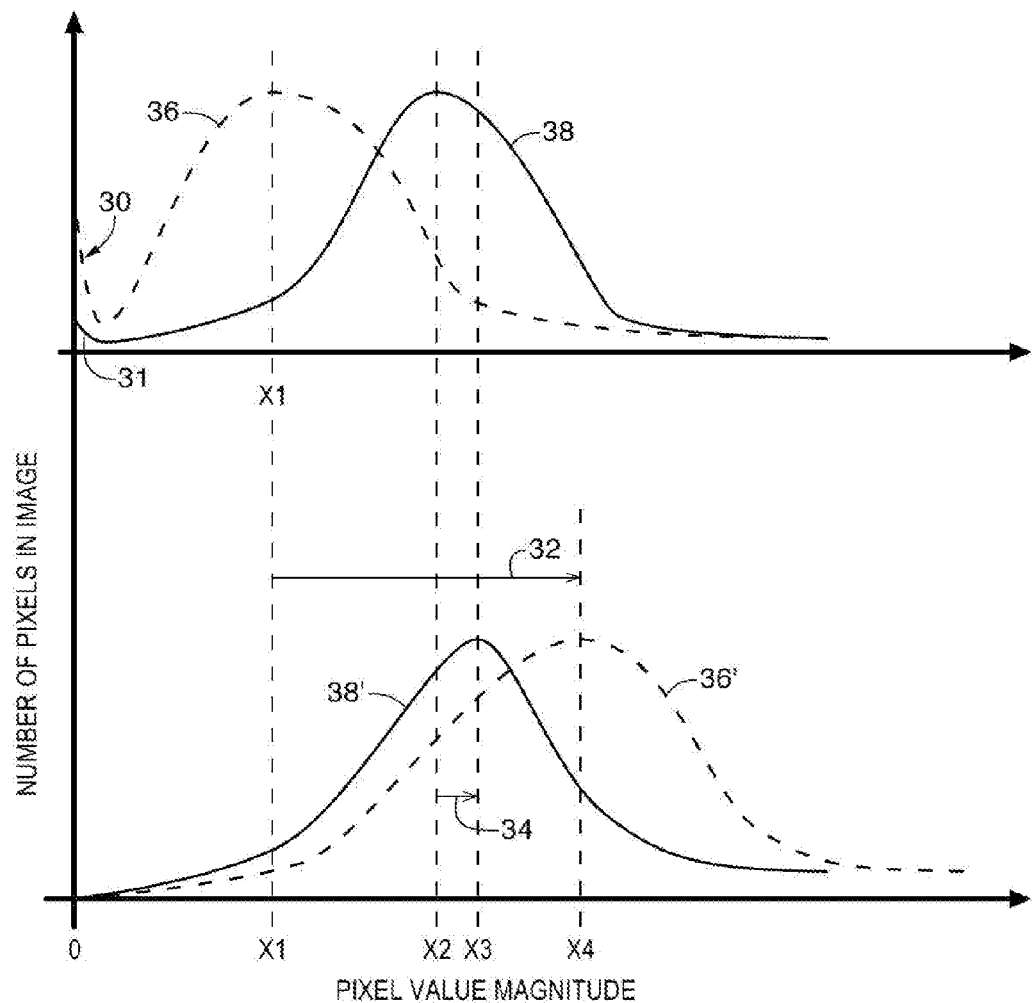
FIG. 3 is a graph showing how processing circuitry in an imaging system may add different black pedestal values to pixel values in different color channels for mitigating pixel value clipping in accordance with an embodiment of the present invention.

FIG. 3 is an illustrative plot showing how processing circuitry 22 may apply different black pedestal values to the pixel values in each channel for preventing pixel value clipping at low magnitudes. As shown in FIG. 3, curve 36 illustrates a histogram of pixel value magnitudes generated by clear filter pixel array 18 in a first color channel and curve 38 illustrates a histogram of pixel value magnitudes generated by clear filter pixel array 18 in a second color channel. In the example of FIG. 3, curve 36 may illustrate the number of red pixel values captured by red pixels 26 in array 18 as a function of pixel value magnitude whereas curve 38 may illustrate the number of clear pixel values captured by clear pixels 26 in array 18 as a function of pixel value magnitude. Processing circuitry 22 may identify histograms 36 and 38 during processing of the pixel values received from clear filter pixel array 18.

Processing circuitry 22 may identify pixel value statistics associated with each pixel value color channel. For example, processing circuitry 22 may identify statistics associated with histograms 36 and 38. Red pixel value histogram 36 may have a first mean value X1 and clear pixel value histogram 38 may have a second mean value X2 that is greater than mean value X1 associated with the red pixel value channel (e.g., because clear image pixels 26 filter out less of the light received from lens 14 than red image pixels 26).

Noise in pixel array 18 (e.g., electronic cross-talk, thermal noise, etc.) may cause pixel array 18 to generate negative pixel values during low light conditions. Negative pixel values generated by array 18 may be truncated to a zero pixel value during image processing operations. Red pixel value histogram 36 may include red channel clipping artifact 30 due to negative pixel values for histogram 36 being truncated to a zero pixel value magnitude. Clear pixel value histogram 38 may include a clear channel clipping artifact 31 due to negative pixel values for histogram 38 being truncated to a zero pixel value. Clear channel clipping artifact 31 may be smaller than red channel clipping artifact 30 because red pixel values generated by array 18 have a lesser mean pixel value magnitude than clear pixel values generated by array 18 (e.g., pixel array 18 may gather more negative red pixel values than negative clear pixel values).

Processing circuitry 22 may identify a first black pedestal value 32 for red pixel value histogram 36 and may identify a second black pedestal value 34 for clear pixel value histogram 38. Black pedestal value 32 associated with red pixel value histogram 36 may be smaller than black pedestal value 34 associated with clear pixel value histogram 38, because more clipping is present in the red pixel value channel than in the clear pixel value channel. Processing circuitry 22 may select the magnitude of black pedestals 32 and 34 to mitigate any clipping in the associated histogram.

Processing circuitry 22 may add first black pedestal value 32 to the red pixel values associated with red pixel value histogram 36 to generate corrected red pixel values, as illustrated by corrected red pixel value histogram 36'. Corrected red pixel value histogram may have a mean value X4 that is greater than mean value X1. Processing circuitry 22 may add second black pedestal value 34 to the clear pixel values associated with clear pixel value histogram 38 to generate corrected clear pixel values, as illustrated by corrected clear pixel value histogram 38'. Corrected clear pixel value histogram 38' may a mean value X3 that is greater than mean value X2. Corrected histograms 36' and 38' are shifted relative to histograms 36 and 38 so that no clipping (or suitably low amount of clipping) is present in the corrected histograms (e.g., so that no negative pixel values from the associated channel are truncated to a zero pixel value). In scenarios where a particular color channel has no clipping, processing circuitry 22 may add a zero-magnitude black pedestal value to the pixel values from that channel (e.g., processing circuitry 22 may omit black pedestal correction operations on that channel).

The example of FIG. 3 is merely illustrative. In general, pixel value histograms such as pixel value histograms 36 and 38 may be generated for each color channel (e.g., processing circuitry 22 may generate an additional blue pixel value histogram based on the blue pixel values captured by clear filter pixel array 18, etc.). Processing circuitry 22 may generate different black pedestal values for each color channel based on the associated pixel value histograms (e.g., to mitigate clipping in each pixel value channel). In general, if processing circuitry 22 generates insufficiently small black pedestal values, processing circuitry 22 may be unable to completely remove pixel value clipping for the pixel values in the corresponding color channel, whereas if processing circuitry 22 generates excessively large black pedestal values, the dynamic range of the pixel values in the associated channel may be undesirably reduced. If desired, processing circuitry 22 may select the least black pedestal value for a particular color channel that removes the pixel value clipping from the pixel values in that color channel so as to maintain the dynamic range of the pixel values in that channel. Optionally, processing circuitry 22 may boost the image signals (e.g., in low-light conditions), apply white balance gains and other channel adjustments prior to or after performing analog-to-digital conversion operations on the image signals and either before or after black pedestal addition or subtraction. The black pedestal adjustment logic in the processing circuitry 22 may observe these adjustments when determining the desired black pedestal adjustments.

Figure 4:
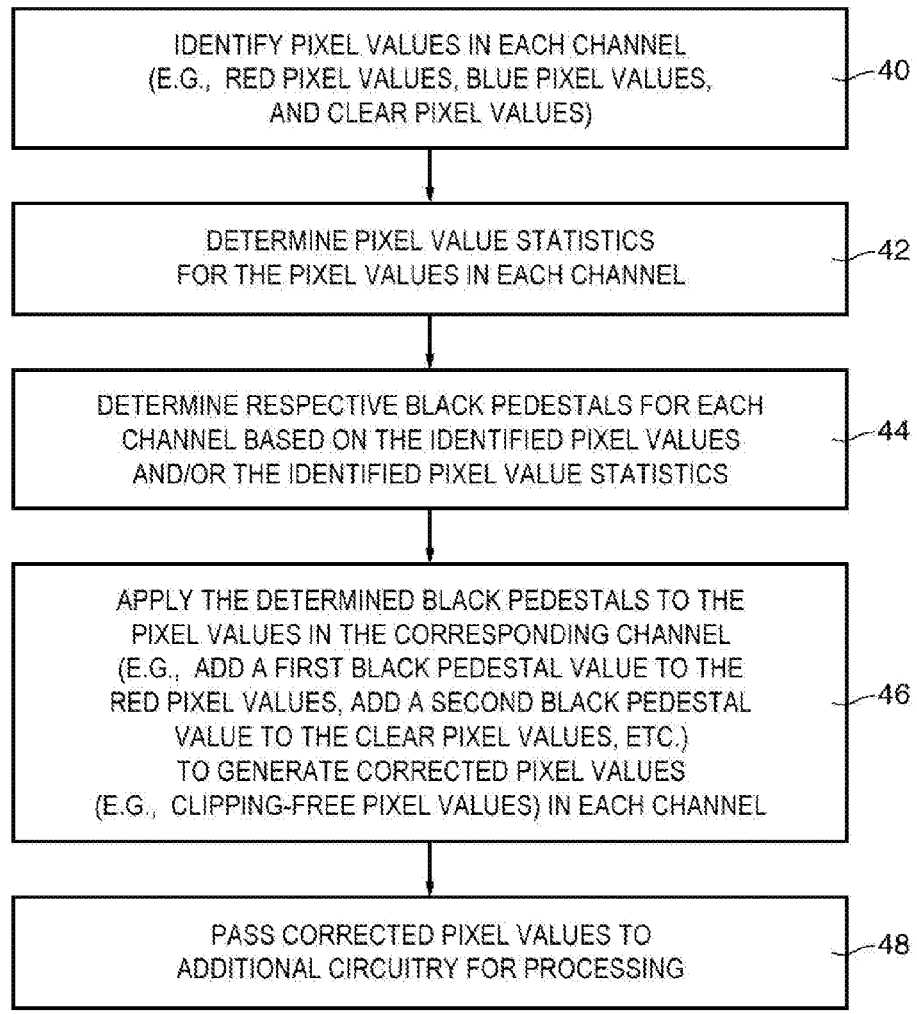
FIG. 4 is a flow chart of illustrative steps that may be performed by processing circuitry in an imaging system to generate corrected pixel values that have been compensated for pixel value clipping by generating different black pedestal values for each color channel in accordance with an embodiment of the present invention.

FIG. 4 is a flow chart of illustrative steps that may be performed by storage and processing circuitry 22 of FIG. 1 for mitigating pixel value clipping by applying channel-dependent black pedestals to pixel values captured by clear filter pixel array 18. Processing circuitry 22 may perform the steps of FIG. 4 after receiving pixel values from image sensor 16 in multiple color channels (e.g., after receiving blue pixel values generated by blue image pixels 26, red pixel values generated by red image pixels 26, and clear pixel values generated by clear image pixels 26).

At step 40, processing circuitry 22 may identify pixel values in each channel. For example, processing circuitry 22 may identify red pixel values, blue pixel values, and clear pixel values in the pixel values received from image sensor 16.

At step 42, processing circuitry may identify pixel value statistics associated with the pixel values in each color channel. For example, processing circuitry 22 may identify respective histograms of pixel values such as histograms 36 and 38 as shown in FIG. 3. Processing circuitry 22 may compute statistical values associated with the pixel values in each channel (e.g., associated with the histograms of pixel values in each channel) such as mean pixel values, median pixel values, dynamic range values, deviation values, variance values, or any other desired statistical parameters associated with the pixel values in each color channel. For example, processing circuitry may compute a first mean pixel value associated with the red pixel values, a second mean pixel value associated with the clear pixel values, a third mean pixel value associated with the blue pixel values, etc. If desired, processing circuitry 22 may identify imaging conditions (e.g., imaging conditions as identified by metadata generated by image sensor 16 and/or processing circuitry 22) associated with the pixel values generated by clear filter pixel array 18. For example, processing circuitry 22 may identify light levels, SNR values, dynamic range values, or any other desired imaging conditions along with further processing configuration, associated with each color channel (e.g., circuitry 22 may identify a first SNR value associated with the red pixel values, a second SNR value associated with the clear pixel values, etc.).

At step 44, processing circuitry 22 may determine respective black pedestal values for each color channel based on the identified pixel values, pixel value statistics, and/or imaging conditions associated with that color channel. For example, processing circuitry 22 may compute greater black pedestal values for color channels having lesser mean pixel values than for color channels having greater mean pixel values. As another example, processing circuitry 22 may compute greater black pedestal values for color channels having relatively low light levels and lesser black pedestal values for color channels having relatively high light levels. As yet another example, processing circuitry 22 may compute greater black pedestal values for color channels having lesser SNR values than for color channels having greater SNR values. Processing circuitry 22 may select different black pedestal values for each color channel that compensate for any pixel value clipping in that color channel.

At step 46, processing circuitry 22 may apply the black pedestal values to the pixel values from the corresponding color channels (e.g., processing circuitry 22 may adjust the pixel values in each channel based on the corresponding black pedestal value associated with that channel). If desired, processing circuitry 22 may add the black pedestal values to the pixel values from the associated color channel. For example, processing circuitry 22 may add first black pedestal value 32 to the red pixel values associated with curve 36 (as shown in FIG. 3) and may add second black pedestal value 34 to the clear pixel values associated with curve 38 to generate corrected pixel values as illustrated by corrected pixel value histograms 36' and 38,' respectively. In other words, processing circuitry 22 may increase the mean pixel value for each color channel by adding a color channel dependent black pedestal value to the pixel values in that color channel. In this way, processing circuitry 22 may generate corrected pixel values for each channel that are free from clipping.

At step 48, processing circuitry 22 may pass the corrected pixel values to additional processing circuitry for additional image processing (e.g., white balance operations, interpolation operations, demosaic operations, color correction operations, display operations, etc.).

Figure 5:
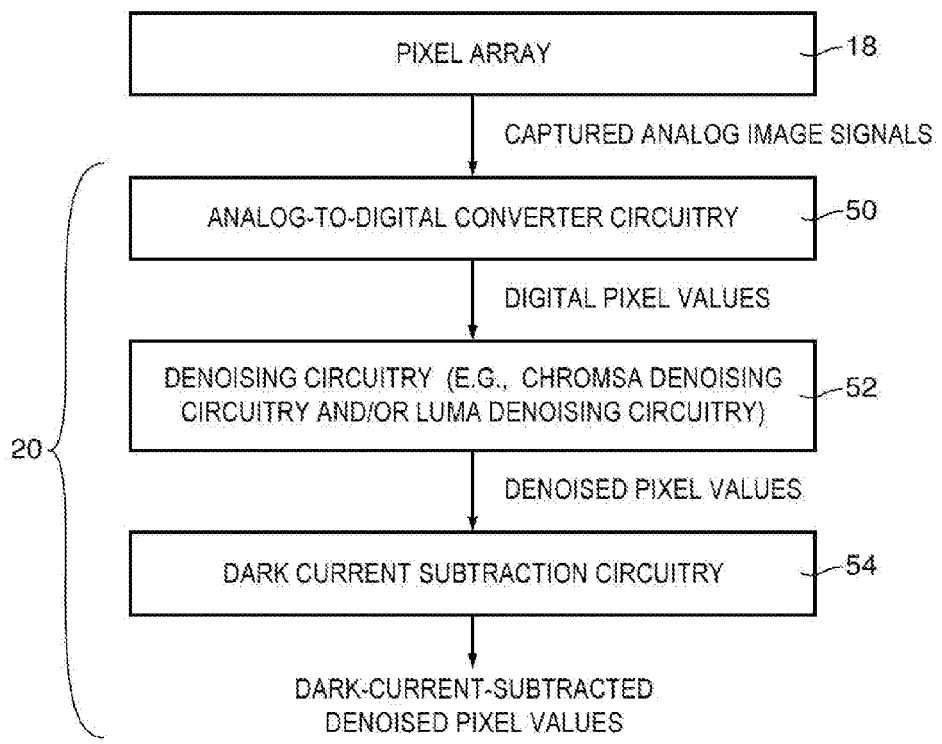
FIG. 5 is a diagram showing how pixel readout and processing circuitry in an imaging system may be used to perform dark current subtraction on pixel values after denoising the pixel values for mitigating pixel value clipping in accordance with an embodiment of the present invention.

Pixel control and readout circuitry 20 in image sensor 16 may include circuitry for performing denoising operations on the pixel values generated by clear filter pixel array 18 and may include circuitry for removing dark current from the pixel values generated by clear filter pixel array 18. FIG. 5 is a block diagram of illustrative pixel control and readout circuitry for removing dark current from the pixel values generated by clear filter pixel array 18.

As shown in FIG. 5, clear filter pixel array 18 may generate analog image signals in response to receiving light from lens 14 (FIG. 1). Pixel array 18 may pass the analog image signals to pixel control and readout circuitry 20. Pixel control and readout circuitry 20 may include analog-to-digital converter (ADC) circuitry 50, denoising circuitry 52, and dark current subtraction circuitry 54 (sometimes referred to herein as dark current removal circuitry 54).

If desired, ADC circuitry 50 may include one or more analog-to-digital converter circuits. ADC circuitry 50 may perform analog-to-digital conversion operations on the analog image signals received from clear filter pixel array 18 to generate digital image data (e.g., digital pixel values). ADC circuitry 50 may include any desired type of ADC architecture (e.g., direct conversion ADC architecture, integrating ADC architecture, successive-approximation ADC architecture, ramp-compare ADC architecture, etc.). ADC circuitry 50 may pass the pixel values to denoising circuitry 52.

Denoising circuitry 52 may generate denoised pixel values by performing denoising operations on the pixel values received from ADC circuitry 50. If desired, denoising circuitry 52 may perform chrominance denoising operations (sometimes referred to as chroma denoising operations) and/ or luminance denoising operations (sometimes referred to as luma denoising operations) on the received pixel values. Denoising circuitry 52 may perform chroma denoising operations on the received pixel values, for example, by applying a chroma filter to the received pixel values (e.g., a chroma filter that increases noise correlation between pixel values in different color channels). Denoising circuitry 52 may pass the denoised pixel values to dark current subtraction circuitry 54.

Dark current subtraction circuitry 54 may generate dark-current-subtracted denoised pixel values by removing dark current from the denoised pixel values received from denoising circuitry 52. For example, dark current subtraction circuitry 54 may perform dark current subtraction operations by subtracting a dark current value from the denoised pixel values. By performing dark current subtraction operations after denoising the pixel values, control circuitry 20 may mitigate (e.g., control circuitry 20 may completely eliminate or substantially reduce) the amount of clipping caused by the removal of the dark current from the pixel values. Dark current subtraction circuitry 54 may pass dark-current-subtracted denoised pixel values to processing circuitry 22 for further image processing operations.

Figure 6:
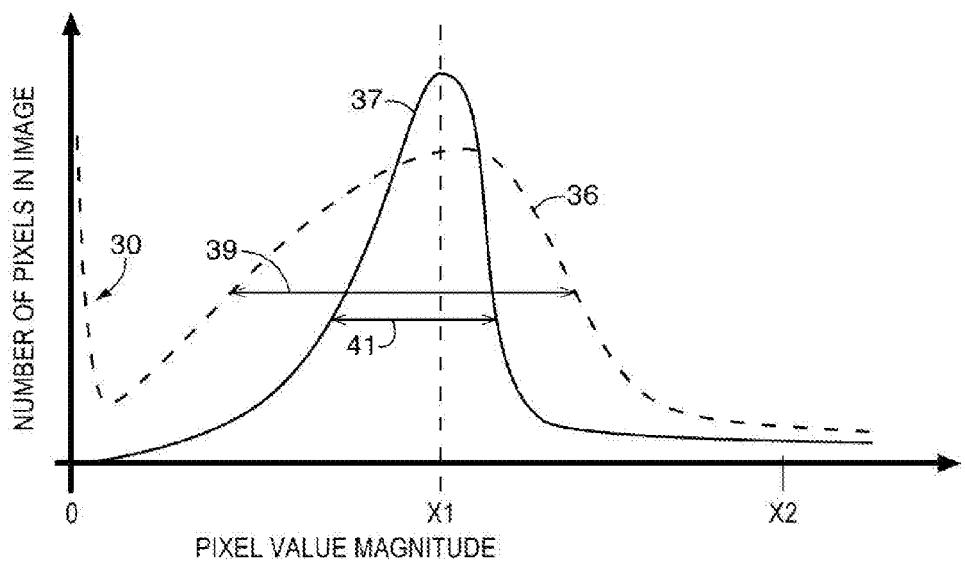
FIG. 6 is a graph showing how using denoising circuitry in an imaging system to denoise pixel values prior to performing dark current subtraction on denoised pixel values may reduce pixel value clipping in accordance with an embodiment of the present invention.

FIG. 6 is an illustrative plot showing how pixel control and readout circuitry 20 may mitigate pixel value clipping generated by the removal of dark current from the pixel values by performing dark current subtraction after performing denoising operations on the pixel values. As shown in FIG. 6, curve 36 is a histogram of pixel value magnitudes (e.g., a histogram of a flat but noisy region in the captured image) in a particular color channel (e.g., the red channel as shown in FIG. 3). Pixel value histogram 36 has a width 39 (e.g., a full-width-half-maximum value that illustrates the spread of pixel value magnitudes in the associated channel). Pixel value histogram 36 may include clipping artifact 30. If dark current is removed (e.g., subtracted) from the pixel values associated with histogram 36, clipping artifact 30 may be amplified (e.g., as additional negative pixel values are truncated to zero).

Denoising circuitry 52 may perform denoising operations on the pixel values associated with histogram 36 to generate denoised pixel values, as illustrated by curve 37 (e.g., denoised pixel value histogram 37). Denoised pixel value histogram 37 has a width 41 (e.g., a full-width-half-maximum value) that is less than width 39 associated with the pixel values prior to denoising. Because denoised pixel value histogram 37 has a width that is substantially less than the width of the corresponding pixel value histogram 36 prior to performing denoising operations, dark current subtraction circuitry 54 may perform dark current subtraction operations on the pixel values associated with denoised pixel value histogram 37 without generating clipping artifacts (e.g., none of the denoised pixel values has a negative or zero magnitude after dark current subtraction is performed). In other words, by performing denoising operations prior to dark current subtraction, row control and readout circuitry 20 may mitigate clipping in the pixel values generated by pixel array 18.

If desired, denoising circuitry 32 may reduce cross-channel correlations (e.g., between the red and the higher-fidelity clear channel) instead of performing per-channel denoising. Such operation may convert the noise distribution of the lower SNR signals to the higher-fidelity, higher SNR channel, which has similar effect to the histogram 36 (i.e., reducing histogram width 39 to width 41). However, during such operation the luma channel is preserved, which is an important advantage over common denoising operations in which the luma channel is not preserved.

Figure 7:
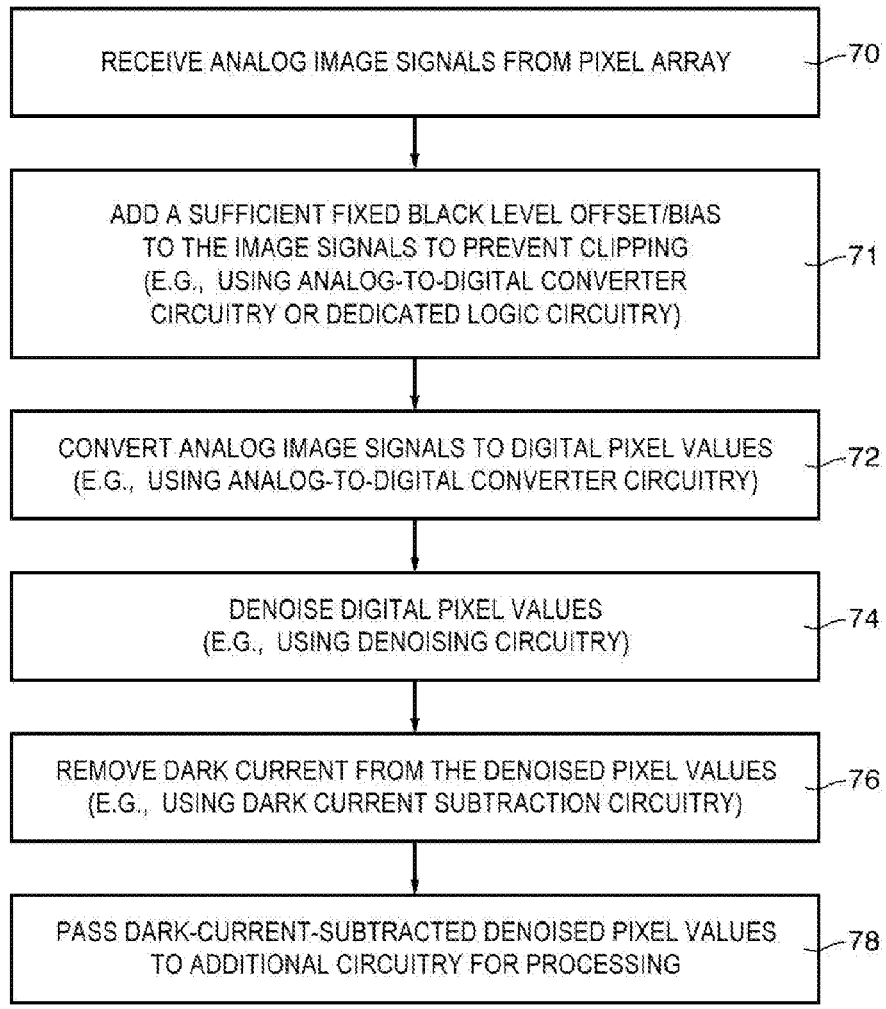
FIG. 7 is a flow chart of illustrative steps that may be performed by pixel readout and processing circuitry in an imaging system to perform dark current subtraction operations on pixel values after denoising the pixel values for mitigating pixel value clipping in accordance with an embodiment of the present invention.

FIG. 7 is a flow chart of illustrative steps that may be performed by processing circuitry such as pixel control and readout circuitry 20 of FIG. 1 for generating dark-current-subtracted denoised image data.

At step 70, pixel control circuitry 20 may receive analog image signals from clear filter pixel array 18. For example, ADC circuitry 50 in pixel control circuitry 20 may receive the image signals from clear filter pixel array 18.

At step 71, ADC circuitry 50 may raise the image signals by desired black pedestal values. If desired, ADC circuitry 50 may include an ADC level/bias adjustment logic configured to add desired black pedestal values to the image signals. In another suitable arrangement, separate logic circuitry (e.g., logic that is separate from ADC circuitry 50) may add desired black pedestal values to the image signals.

At step 72, ADC circuitry 50 may convert the received analog image signals to digital pixel values. ADC circuitry 50 may pass the digital pixel values to denoising circuitry 52.

At step 74, denoising circuitry 52 may generate denoised pixel values by performing denoising operations on the digital pixel values received from ADC circuitry 50. If desired, circuitry 52 may perform chroma denoising and/or luminance denoising operations on the received pixel values. Denoising circuitry 52 may pass the denoised pixel values to dark current subtraction circuitry 54.

At step 76, dark current subtraction circuitry 54 may remove dark current from the denoised pixel values. For example, circuitry 54 may subtract a dark current value from the denoised pixel values to generate dark-current-subtracted denoised pixel values. If desired, a single dark current value may be subtracted from each pixel value generated by clear filter pixel array 18.

At step 78, pixel control circuitry 20 may pass the dark-current-subtracted denoised pixel values to additional processing circuitry for performing additional image processing operations.

FIGS. 5-7 are merely illustrative. If desired, storage and processing circuitry 22 may include denoising circuitry and dark current subtraction circuitry for removing dark current from pixel values generated by clear filter pixel array 18 (e.g., steps 74-78 may, if desired, be performed by processing circuitry 22).

Figure 8:
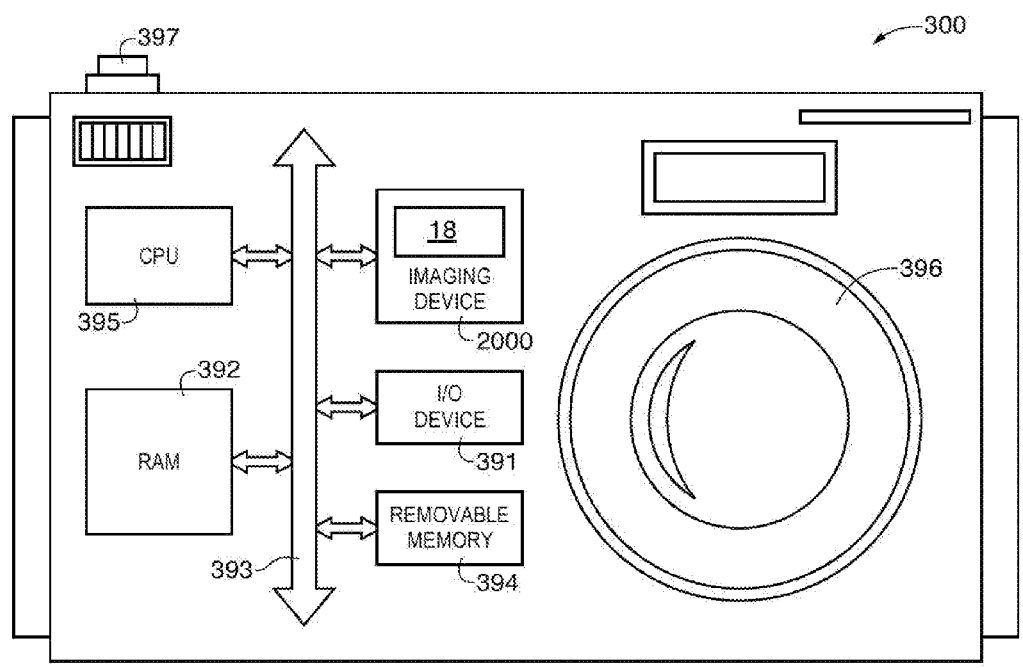
FIG. 8 is a block diagram of a processor system employing the embodiments of FIGS. 1-7 in accordance with an embodiment of the present invention.

FIG. 8 shows in simplified form a typical processor system 300, such as a digital camera, which includes an imaging device 2000 (e.g., an imaging device 2000 such as imaging sensor 16 and storage and processing circuitry 22 of FIGS. 1-9 employing clear color filters, circuitry for mitigating pixel value clipping, and the techniques for operations described above). Processor system 300 is exemplary of a system having digital circuits that may include imaging device 200. Without being limiting, such a system may include a computer system, still or video camera system, scanner, machine vision, vehicle navigation, video phone, surveillance system, auto focus system, star tracker system, motion detection system, image stabilization system, and other systems employing an imaging device.

Processor system 300, which may be a digital still or video camera system, may include a lens such as lens 396 for focusing an image onto a pixel array such as pixel array 18 when shutter release button 397 is pressed. Processor system 300 may include a central processing unit such as central processing unit (CPU) 395. CPU 395 may be a microprocessor that controls camera functions and one or more image flow functions and communicates with one or more input/output (I/O) devices 391 over a bus such as bus 393. Imaging device 200 may also communicate with CPU 395 over bus 393. System 300 may include random access memory (RAM) 392 and removable memory 394. Removable memory 394 may include flash memory that communicates with CPU 395 over bus 393. Imaging device 200 may be combined with CPU 395, with or without memory storage, on a single integrated circuit or on a different chip. Although bus 393 is illustrated as a single bus, it may be one or more buses or bridges or other communication paths used to interconnect the system components.

Various embodiments have been described illustrating imaging systems with pixel value clipping mitigation capabilities. An imaging system may include an image sensor having an array of image sensor pixels coupled to processing circuitry. The processing circuitry may include converter circuitry, denoising circuitry, and dark current subtraction circuitry. The array of image sensor pixels may be provided with a color filter array having repeating unit cells of clear color filter elements, blue color filter elements, and red color filter elements (or any other color filter elements of any desired colors).

The image sensor pixels may generate analog image signals in response to received image light. For example, the image sensor pixels may generate clear image signals in response to receiving clear light through the clear color filter elements, may generate red image signals in response to receiving red light through the red color filter elements, and may generate blue image signals in response to receiving blue light through the blue color filter elements. The converter circuitry may convert the image signals into digital pixel values (e.g., clear pixel values, red pixel values, and blue pixel values) and the denoising circuitry may perform denoising operations on the digital pixel values (e.g., the denoising circuitry may denoise the digital pixel values) to generate denoised pixel values. The dark current subtraction circuitry may subsequently subtract a dark current value from the denoised pixel values. By performing dark current subtraction on the image signals after performing analog-to-digital conversion and denoising operations on the image signals, the imaging system may mitigate any pixel value clipping in the final image generated by the imaging system.

The processing circuitry may determine respective black pedestal values for pixel values captured by the pixel array in different color channels. The processing circuitry may process image data received from the pixel array that includes first pixel values of a first color (e.g., clear pixel values generated by clear image pixels), second pixel values of a second color that is different from the first color (e.g., red pixel values generated by red image pixels), and third pixel values of a third color that is different from the first and second colors (e.g., blue pixel values generated by the blue image pixels). The processing circuitry may, for example, determine a first black pedestal value based on the first pixel values, a second black pedestal value based on the second pixel values, and a third black pedestal value based on the third pixel values (e.g., the processing circuitry may determine different black pedestal values for each color channel).

The processing circuitry may add the first black pedestal value to the first pixel values, may add the second black pedestal value to the second pixel values, and may add the third black pedestal value to the third pixel values. If desired, the processing circuitry may determine whether the pixel values of a particular color are free from pixel value clipping. If the pixel values are free from pixel value clipping, the processing circuitry may identify the associated black pedestal value as zero-magnitude black pedestal value (e.g., the processing circuitry may set the corresponding black pedestal value to zero).

If desired, the processing circuitry may generate respective sets of statistics associated for the pixel values in each color channel and may generate the black pedestal values based on the set of pixel value statistics associated with the corresponding color channel. If desired, the processing circuitry may identify light levels and/or signal-to-noise ratio values based on the pixel values and may determine the black pedestal values based on the identified light levels and/or signal-to-noise ratios.

The imaging system with a clear filter pixel array and processing circuitry and the associated techniques for mitigating pixel value clipping in the imaging system may be implemented in a system that also includes a central processing unit, memory, input-output circuitry, and an imaging device that further includes a pixel array, and a data converting circuit.

The foregoing is merely illustrative of the principles of this invention and various modifications can be made by those skilled in the art without departing from the scope and spirit of the invention. The foregoing embodiments may be implemented individually or in any combination.

What is claimed is:

1. A method for operating an imaging system comprising processing circuitry and an image sensor having an array of image pixels, the method comprising:
   capturing, by the image sensor, first pixel values of a first color in response to image light;
   capturing, by the image sensor, second pixel values of a second color that is different from the first color in response to the image light;
   with the processing circuitry, determining a first black pedestal value based on the first pixel values;
   with the processing circuitry, determining a second black pedestal value based on the second pixel values, wherein the second black pedestal value is different from the first black pedestal value;
   with the processing circuitry, adding the first black pedestal value to the first pixel values to generate first corrected pixel values;
   with the processing circuitry, adding the second black pedestal value to the second pixel values to generate second corrected pixel values, wherein the first and second corrected pixel values are substantially free from clipping; and
   generating, by the processing circuitry, an output image based on the generated first and second corrected pixel values.

2. The method defined in claim 1, wherein the first pixel values comprise clear pixel values and wherein determining the first black pedestal value comprises:
   determining the first black pedestal value based on the clear pixel values.

3. The method defined in claim 2 further comprising:
   capturing, by the image sensor, blue pixel values in response to the image light; and
   with the processing circuitry, determining a third black pedestal value based on the blue pixel values, wherein the third black pedestal value is different from the first and second black pedestal values.

4. The method defined in claim 3, further comprising:
   with the processing circuitry, adding the third black pedestal value to the blue pixel values to generate third corrected pixel values; and
   generating, by the processing circuitry, the output image based on the generated first, second, and third corrected pixel values.

5. The method defined in claim 2, wherein adding the first black pedestal value to the first pixel values comprises:
   adding the first black pedestal value to the clear pixel values.

6. The method defined in claim 5, wherein determining the first black pedestal value based on the clear pixel values comprises:
- generating a set of pixel value statistics based on the clear pixel values; and
- determining the first black pedestal value based on the set of pixel value statistics.

7. The method defined in claim 6, wherein generating the set of pixel value statistics comprises:
- generating a clear pixel value histogram based on the clear pixel values; and
- generating the set of pixel value statistics based on the clear pixel value histogram.

8. The method defined in claim 6, wherein determining the second black pedestal value based on the second pixel values comprises:
- generating an additional set of pixel value statistics based on the second pixel values; and
- determining the second black pedestal value based on the additional set of pixel value statistics.

9. The method defined in claim 5, wherein determining the first black pedestal value comprises:
- identifying a light level associated with the clear pixel values; and
- determining the first black pedestal value based on the identified light level.

10. The method defined in claim 5, wherein determining the first black pedestal value comprises:
- identifying a signal to noise ratio value associated with the clear pixel values; and
- determining the first black pedestal value based on the signal to noise ratio value.

11. The method defined in claim 1 further comprising:
- capturing, by the image sensor, third pixel values of a third color in response to the image light, wherein the third color is different from the first and second colors;
- with the processing circuitry, determining a third black pedestal value based on the third pixel values, wherein the third black pedestal value is different from the first and second black pedestal values; and
- with the processing circuitry, adding the third black pedestal value to the third pixel values to generate third corrected pixel values.

12. The method defined in claim 1, wherein the first pixel values comprise red pixel values.

13. The method defined in claim 12, wherein the second pixel values comprise blue pixel values.

14. The method defined in claim 12, wherein the second pixel values comprise clear pixel values.

15. The method defined in claim 1, wherein determining the first black pedestal value comprises:
- identifying a signal to noise ratio value associated with the first pixel values; and
- determining the first black pedestal value based on the signal to noise ratio value.

16. The method defined in claim 15, wherein the first pixel values comprise yellow pixel values and wherein determining the first black pedestal value comprises:
- identifying a signal to noise ratio value associated with the yellow pixel values; and
- determining the first black pedestal value based on the signal to noise ratio value associated with the yellow pixel values.

17. The method defined in claim 1, wherein determining the first black pedestal value comprises:
- identifying a mean value associated with the first pixel values; and
- determining the first black pedestal value based on the mean value.

18. The method defined in claim 11, further comprising:
- generating, by the processing circuitry, the output image based on the generated first, second, and third corrected pixel values.

19. The method defined in claim 18, wherein the third pixel values comprise yellow pixels captured in response to yellow light.

20. The method defined in claim 19, wherein the first pixel values comprise blue pixel values generated in response to blue light and the second pixel values comprise red pixel values generated in response to red light.

* * * * *